(12) United States Patent
Stern et al.

(10) Patent No.: US 9,282,655 B2
(45) Date of Patent: Mar. 8, 2016

(54) ELECTRICAL DISTRIBUTION CENTER

(71) Applicant: Delphi Technologies, Inc., Troy, MI (US)

(72) Inventors: Eric J. Stern, Farmington Hills, MI (US); Jesus R. Morales, Chihuahua (MX); Todd A. Meinberg, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 340 days.

(21) Appl. No.: 13/710,841

(22) Filed: Dec. 11, 2012

(65) Prior Publication Data

US 2014/0160697 A1 Jun. 12, 2014

(51) Int. Cl.
*H05K 5/00* (2006.01)
*H05K 13/00* (2006.01)
*B60R 16/023* (2006.01)

(52) U.S. Cl.
CPC ............ *H05K 5/006* (2013.01); *B60R 16/0238* (2013.01); *H05K 13/00* (2013.01); *Y10T 29/49124* (2015.01)

(58) Field of Classification Search
USPC ............................ 361/752; 439/76.2; 174/250
See application file for complete search history.

(56) References Cited

U.S. PATENT DOCUMENTS

| | | | |
|---|---|---|---|
| 6,077,102 A | 6/2000 | Borzi et al. | |
| 6,126,457 A * | 10/2000 | Smith et al. | 439/76.2 |
| 6,233,153 B1 | 5/2001 | Baur et al. | |
| 7,727,022 B2 | 6/2010 | Polehonki et al. | |
| 2002/0072268 A1 * | 6/2002 | Hoelscher et al. | 439/374 |
| 2005/0231897 A1 | 10/2005 | Yamashita | |
| 2008/0156518 A1 * | 7/2008 | Honer et al. | 174/250 |
| 2009/0258543 A1 | 10/2009 | Keyser et al. | |

FOREIGN PATENT DOCUMENTS

EP 1 279 323 B1 8/2006

OTHER PUBLICATIONS

European Search Report dated Aug. 1, 2014.

\* cited by examiner

*Primary Examiner* — Andargie M Aychillhum

(74) *Attorney, Agent, or Firm* — Thomas H. Twomey

(57) ABSTRACT

An electrical distribution center includes an upper housing, a circuit board disposed in the upper housing, and a lower housing having a plurality of lower terminal receiving cavities and a plurality of alignment cavities. A plurality of terminals is mounted on the circuit board such that each terminal is in electrical communication with a respective electrically conductive member. The terminals have contact portions below the circuit board and disposed in the lower terminal receiving cavities such that each of the terminals extends from the circuit board no more than a first predetermined distance. A plurality of alignment posts are fixed to the circuit board and received within the alignment cavities such that each of the alignment posts extends from the circuit board at least a second predetermined distance which is greater than the first predetermined distance.

10 Claims, 6 Drawing Sheets

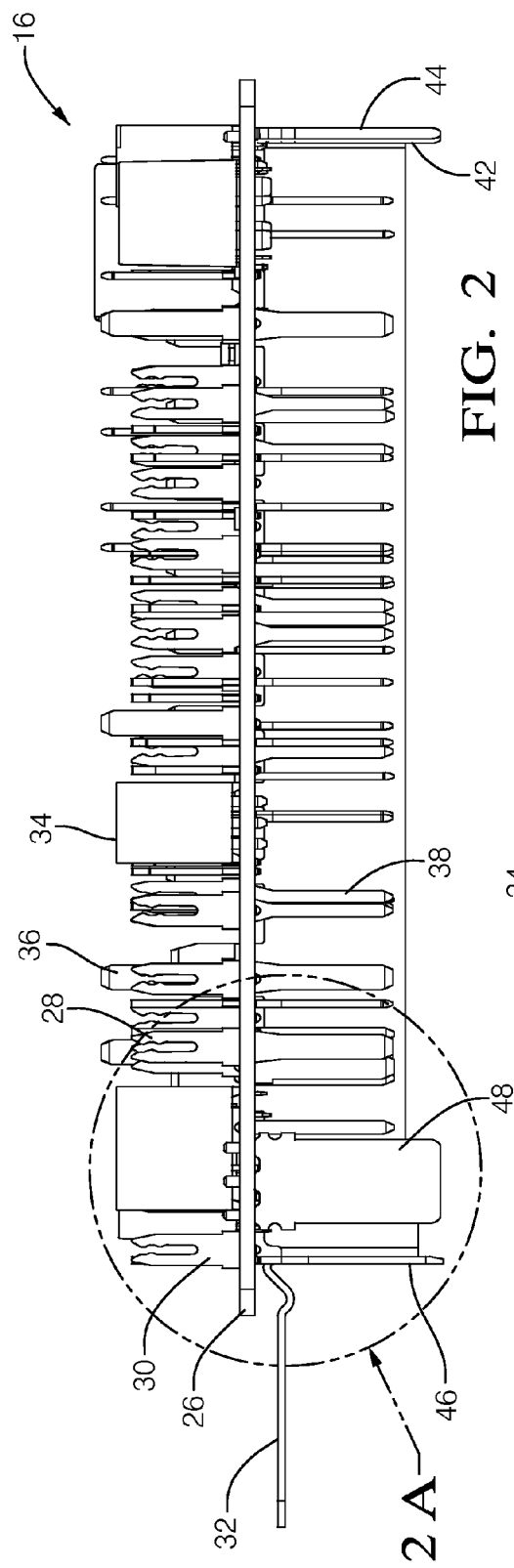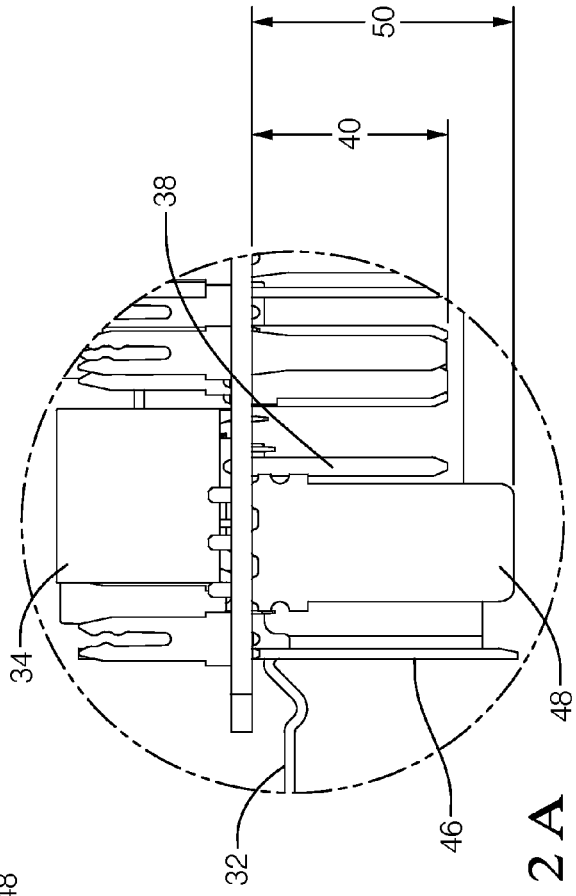

ELECTRICAL DISTRIBUTION CENTER

TECHNICAL FIELD OF INVENTION

The present invention relates to an electrical distribution center; more particularly to an electrical distribution center having a circuit board disposed between an upper housing and a lower housing; and even more particularly to such an electrical distribution center where the circuit board includes features fixed thereto which interface with corresponding features of the lower housing to align the circuit board to the lower housing during assembly.

BACKGROUND OF INVENTION

Electrical distribution centers are being widely used in automobiles. The electrical distribution center is a central junction box or block system designed as a standalone assembly which can package various fuses, relays, and other electrical devices in a central location. The electrical distribution centers not only reduce costs by consolidating these various functions into one block, but the electrical distribution centers also reduce the number of cut and spliced leads which help to ensure reliability. Such electrical distribution centers include provisions for electrically connecting a power source and electrical devices housed in the junction block to electrical wiring harness connectors for supplying power and control signals to various electrical systems of the automobile such as an air conditioning system, a fuel system, lighting circuits, instrument panels and to provide signals to engine and auxiliary systems such as anti-lock brake wiring assemblies.

Polehonki et al. entitled "On Harness PCB Electrical Center" and assigned U.S. Pat. No. 7,727,022; the disclosure of which is incorporated herein by reference in its entirety; discloses an electrical distribution center assembly having an upper housing, a circuit board, and a lower housing. The upper housing includes a plurality of upper terminal receiving cavities and the lower housing includes a plurality of lower terminal receiving cavities. The circuit board is disposed in the upper housing below the upper terminal receiving cavities and includes a plurality of terminals mounted thereto which have contact portions above the circuit board that are disposed in the upper terminal receiving cavities for engaging mating terminals plugged into the upper terminal receiving cavities. The plurality of terminals also have contact portions below the circuit board that are disposed in the lower terminal receiving cavities for engaging mating terminals that are attached to the lower terminal receiving cavities. It is imperative that the contact portions below the circuit board be aligned with the center of their intended mating lower terminal receiving cavity. Alignment of the contact portions below the circuit board with the center of their intended mating lower terminal receiving cavity has typically been accomplished using the interface between the upper housing and the lower housing. However; prior to the upper housing, with the circuit board mounted therein, being attached to the lower housing, the circuit board may have some freedom to move laterally within the upper housing. This lateral movement of the circuit board within the upper housing may allow the contact portion of the terminals below the circuit board to be misaligned with respect to their intended mating lower terminal receiving cavity to a degree that does not allow the upper housing to be properly assembled to the lower housing. This misalignment may result in increased assembly time due to the need to manipulate the upper housing, lower housing, and/or circuit board to achieve proper alignment of the contact portions below the circuit board with the center of their intended mating lower terminal receiving cavity. This misalignment may also result in damage to one or more of the terminals if one or more of the contact portions of the terminals contact the lower housing, known as terminal stubbing, rather than each of the contact portions of the terminals below the circuit board being received within their intended mating lower terminal receiving cavity.

What is needed is an electrical distribution center and a method for assembling the electrical distribution center which minimizes or eliminates one or more of the shortcomings as set forth above.

SUMMARY OF THE INVENTION

Briefly described, an electrical distribution center is provided. The electrical distribution center includes an upper housing, a circuit board disposed in the upper housing, and a lower housing having a plurality of lower terminal receiving cavities and a plurality of alignment cavities. A plurality of terminals is mounted on the circuit board such that each terminal is in electrical communication with a respective electrically conductive member. The terminals have contact portions below the circuit board and disposed in the lower terminal receiving cavities such that each of the terminals extends from the circuit board no more than a first predetermined distance. A plurality of alignment posts are fixed to the circuit board and received within the alignment cavities such that each of the alignment posts extends from the circuit board at least a second predetermined distance which is greater than the first predetermined distance.

BRIEF DESCRIPTION OF DRAWINGS

This invention will be further described with reference to the accompanying drawings in which:

FIG. 2 is an elevation view of a circuit board assembly of the electrical distribution center of FIG. 1;

FIG. 2A is an enlarged portion of the circuit board assembly of FIG. 2;

DETAILED DESCRIPTION OF INVENTION

Figure 1:
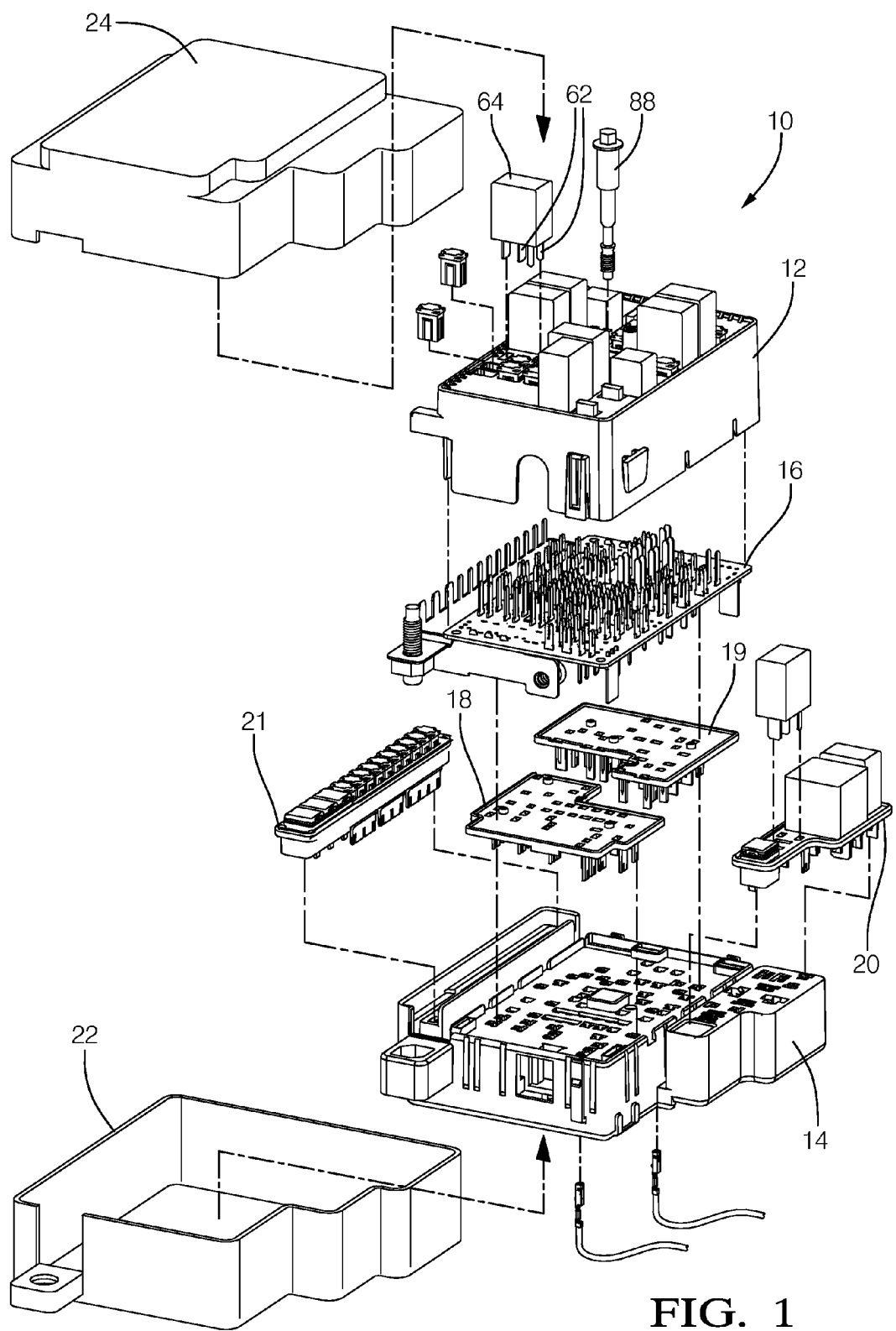
FIG. 1 is an isometric exploded view of an electrical distribution center in accordance the present invention.
Figure 3:
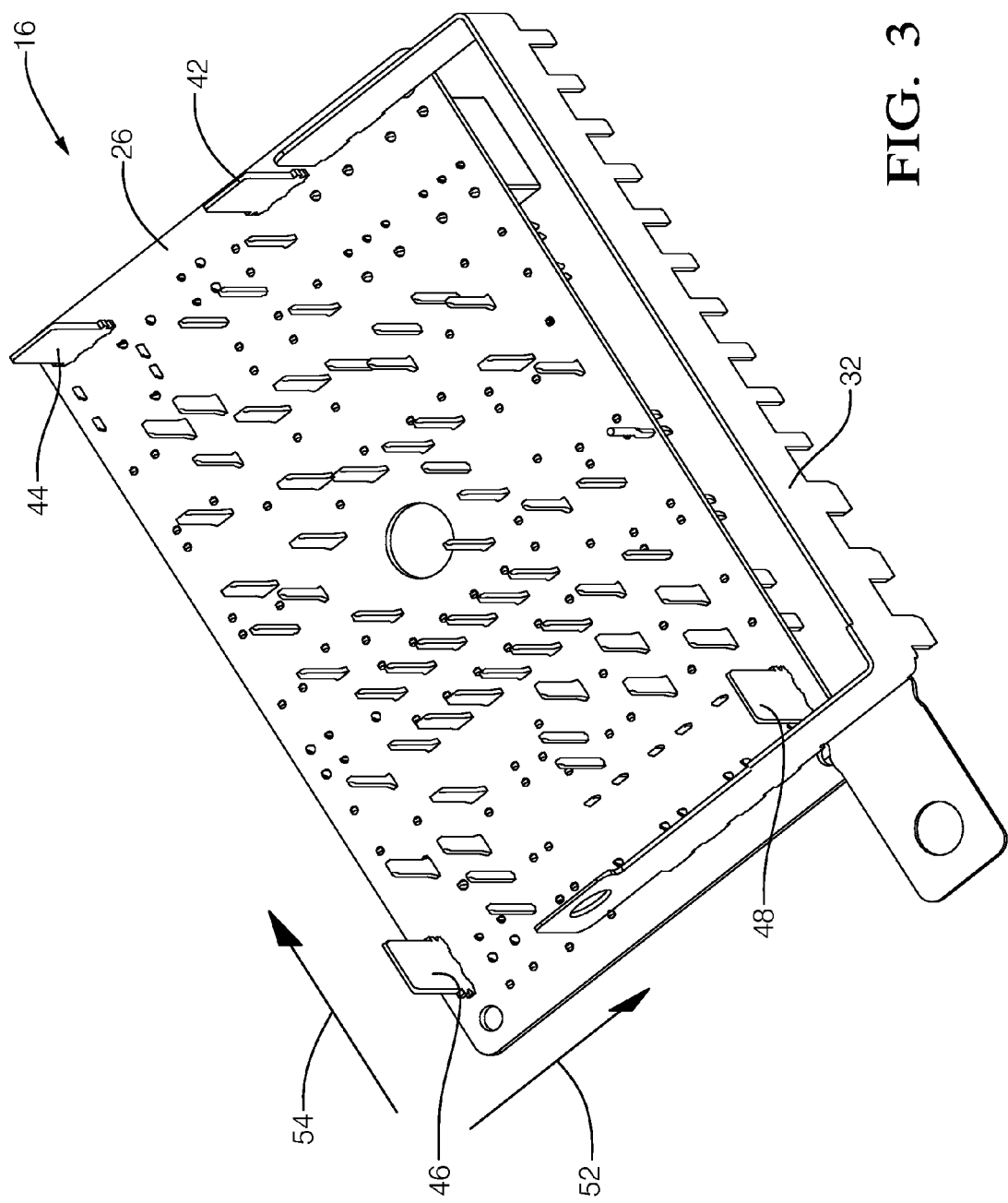
FIG. 3 is an isometric view of the circuit board assembly of FIG. 2.
Figure 4:
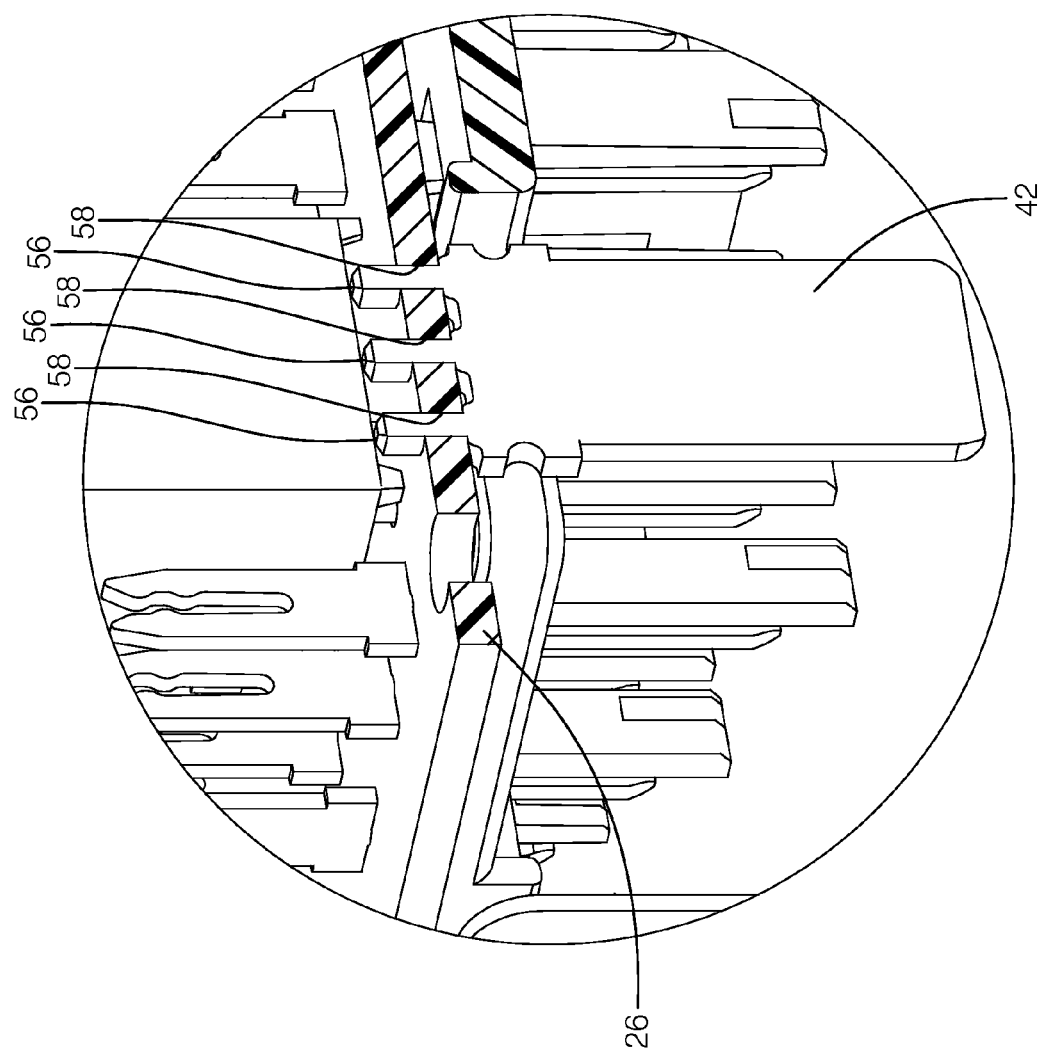
FIG. 4 is an isometric cross-sectional view of a portion of the circuit board of FIG. 2.
Figure 5:
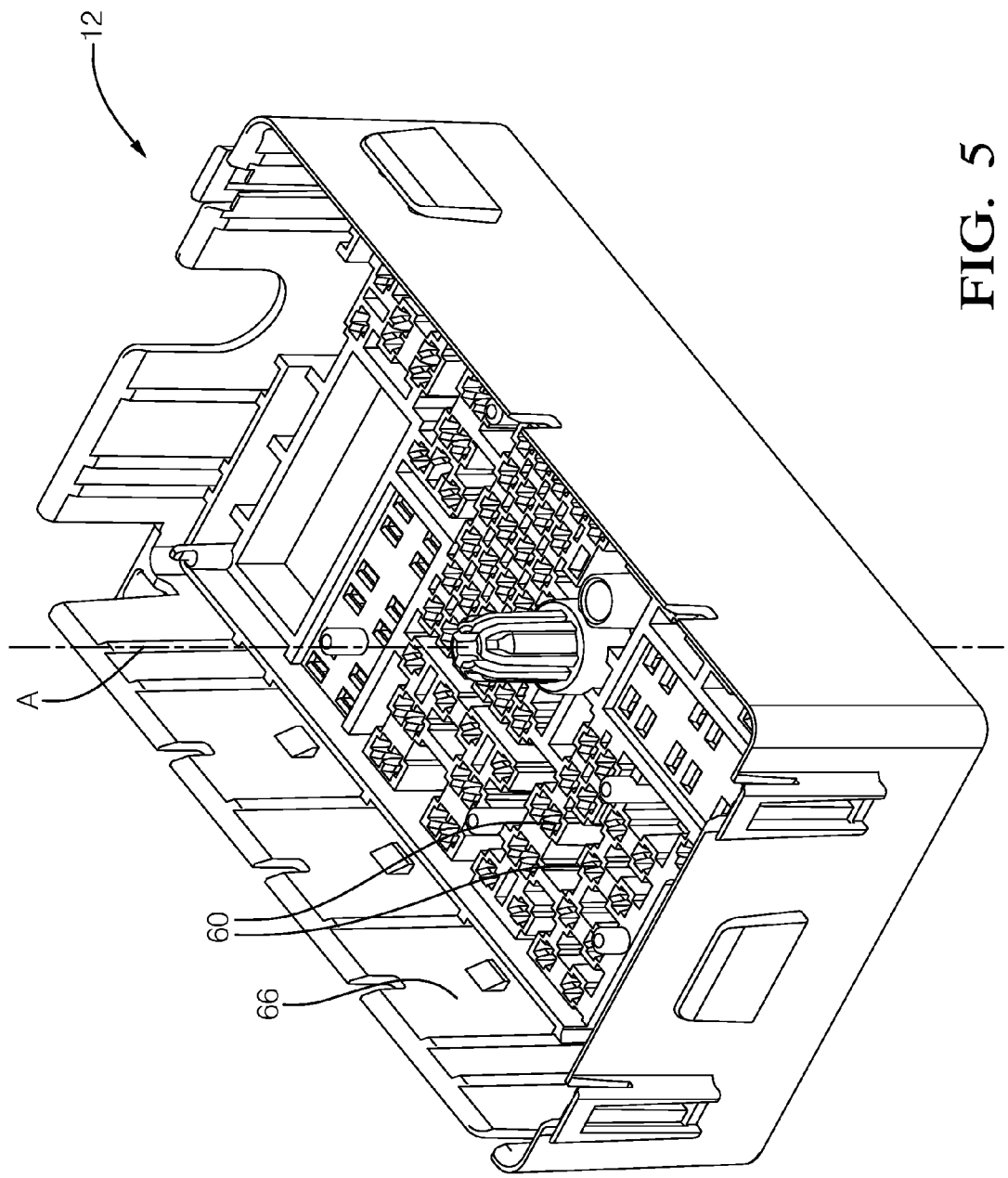
FIG. 5 is an isometric view of an upper housing of the electrical distribution center of FIG. 1.
Figure 6:
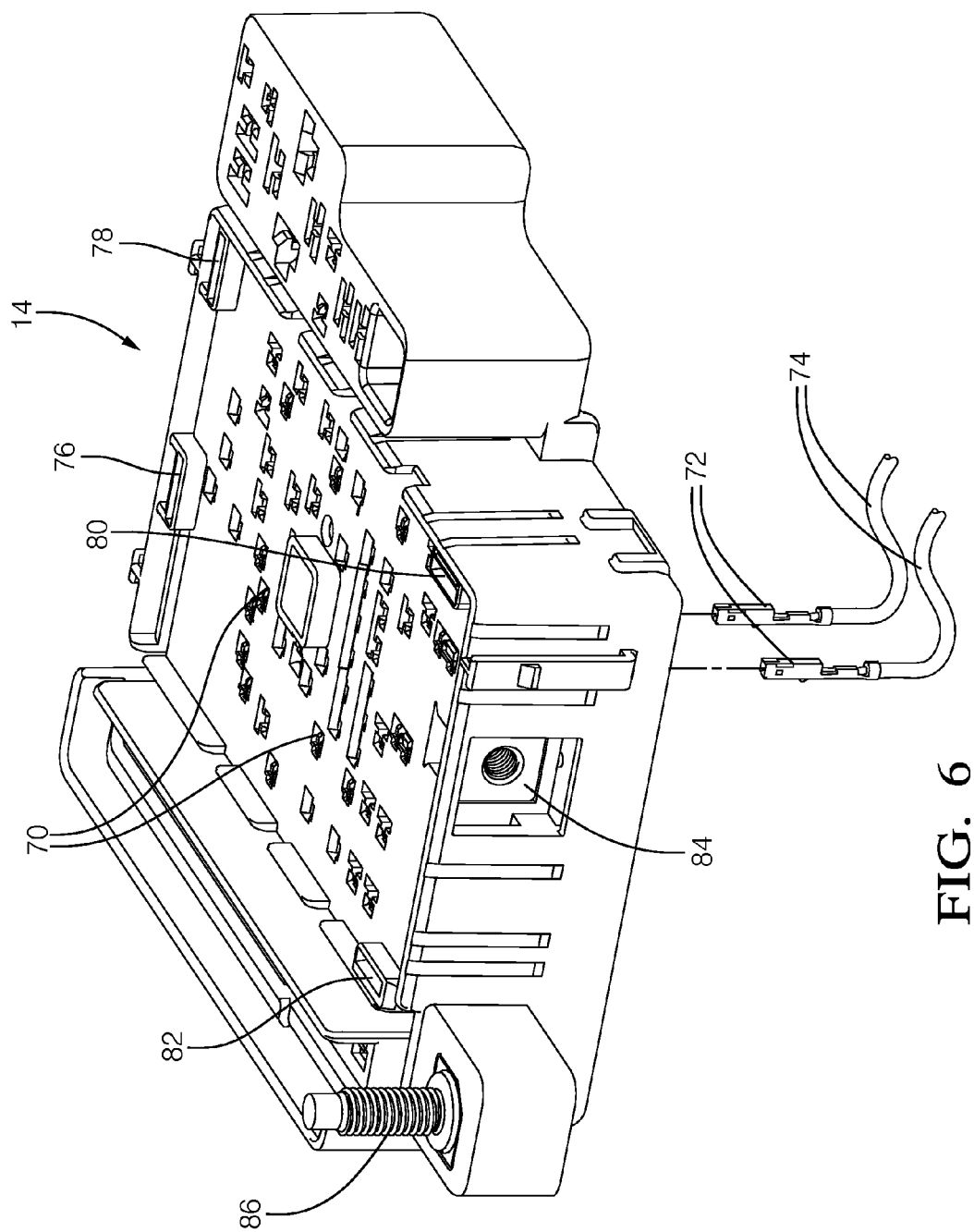
FIG. 6 is an isometric view of a lower housing of the electrical distribution center of FIG. 1.

Referring now to FIGS. 1-6 wherein like reference numerals are used to identify identical components in the various views, an electrical distribution center 10 in accordance with the invention is shown which may be used, for example only, in a motor vehicle. Electrical distribution center 10 generally includes an upper housing 12, a lower housing 14, a circuit board assembly 16 disposed within upper housing 12 between upper housing 12 and lower housing 14, and positive lock reinforcement members 18, 19, 20, 21. Electrical distribution center 10 may be disposed within a splash shield 22 and enclosed therein by a top cover 24 in order to protect electrical distribution center 10 from environmental hazards that may be encountered during the use of electrical distribution center 10.

With continued reference to FIGS. 1-6, circuit board assembly 16 includes an electrically insulative circuit board 26 defining a plane onto which a plurality of two-way pass-through terminals 28, a plurality of one-way terminals 30, bus bar 32, and one or more electronic devices 34, for example only, relays and resistors, are mounted. A plurality of electrical traces 35 may be provided on circuit board 26 to connect two-way pass-through terminals 28, one-way terminals 30, bus bar 32, and electronic devices 34 into various desired circuit patterns. Two-way pass-through terminals 28 have upper contact portions 36 above circuit board 26 and lower contact portions 38 below circuit board 26. Some one-way terminals 30 include only upper contact portions 36 while other one-way terminals 30 include only lower contact portions 38. Lower contact portions 38 extend from circuit board 26 no more than a first predetermined distance 40. It should be noted that, for clarity, only one of each of two-way pass-through terminals 28, one-way and one-way terminals, electrical devices, electrical traces 35, upper contact portions 36 and lower contact portions 38 are labeled in the drawings.

Circuit board assembly 16 also includes a plurality of alignment posts 42, 44, 46, 48 that extend from circuit board 26 in the same direction as lower contact portions 38. Alignment posts 42 extend from circuit board 26 a second predetermined distance 50 such that second predetermined distance 50 is greater than first predetermined distance 40. For example only, second predetermined distance 50 is about 5 mm greater than first predetermined distance 40.

Alignment posts 42, 44, and 46 may be elongated in one direction, represented by arrow 52, in the plane defined by circuit board 26. Alignment post 48 may be elongated in another direction, represented by arrow 54, in the plane defined by circuit board 26 such that direction 54 is substantially perpendicular to direction 52. While alignment posts 42, 44, 46 are shown to all be elongated in the same direction, it should be understood that one or two of alignment posts 42, 44, 46 could be elongated in the same direction as alignment post 48 or in a third direction that is different from both direction 52 and direction 54.

Alignment posts 42, 44, 46, 48 are preferably made of a metallic material, and include one or more tabs 56. Tabs 56 are closely received within alignment post receiving holes 58 in circuit board 26 in order to precisely locate alignment posts 42, 44, 46, 48 on circuit board 26. Alignment posts 42, 44, 46, 48 are secured to circuit board 26 with a solder connection. Alignment posts 42, 44, 46, 48; together with the solder connection; rigidly retain alignment posts 42, 44, 46, 48 to circuit board 26. Alignment posts 42, 44, 46, 48 are preferably located near the perimeter of circuit board 26 and are substantially perpendicular to the plane defined by circuit board 26. While four alignment posts 42, 44, 46, 48 are shown, it should be understood that a greater or lesser number may be provided.

Upper housing 12 may be made of an electrically insulative material, for example, plastic. Upper housing 12 may be made, for example, by a plastic injection molding process where plastic in liquid form is injected into a mold and allowed to solidify before being removed from the mold. Upper housing 12 includes a plurality of upper terminal receiving cavities 60 that extend through upper housing 12. Upper contact portions 36 are disposed in upper terminal receiving cavities 60 for engaging mating terminals, shown as mating blades 62 of fuses 64, plugged into upper terminal receiving cavities 60. For instance, upper contact portions 36 may be a "tuning fork" design that receives mating blades 62. However, other electrical devices such as relays (not shown) are commonly plugged into electrical centers and consequently, one or more of upper contact portions 36 may be of various designs to mate with other types of terminals associated with relays or other electrical or electronic devices that may be plugged into electrical distribution center 10. It should be noted that, for clarity, only two upper terminal receiving cavities 60 are labeled in the drawings.

Upper housing 12 includes a circuit board compartment 66 extending along axis A which is substantially perpendicular to the plane defined by circuit board 26. Circuit board assembly 16 is disposed within circuit board compartment 66 and is retained therein by circuit board retaining clips 68 which may be integrally formed as part of upper housing 12. When circuit board assembly 16 is disposed within circuit board compartment 66, but before upper housing 12 is attached to lower housing 14, circuit board retaining clips 68 retain circuit board assembly 16, but allow circuit board assembly 16 to move laterally, i.e. in the plane defined by circuit board 26.

Lower housing 14 may be made of an electrically insulative material, for example, plastic. Lower housing 14 may be made, for example, by a plastic injection molding process where plastic in liquid form is injected into a mold and allowed to solidify before being removed from the mold. Lower housing 14 includes a plurality of lower terminal receiving cavities 70 that extend through lower housing 14. Lower contact portions 38 are disposed in lower terminal receiving cavities 70 for engaging mating terminals 72 that are attached to wires 74. Lower contact portions 38 are illustrated as blades and mating terminals 72 are illustrated as female terminals in the drawings; however, it should be understood that other types of lower contact portions and mating terminals may be used so long as the lower contact portions mate with the terminals attached to wires 74 when the terminals are plugged into lower terminal receiving cavities 70. It should be noted that, for clarity, only two lower terminal receiving cavities 70 are labeled in the drawings.

Lower housing 14 also includes alignment cavities 76, 78, 80, 82 for receiving alignment posts 42, 44, 46, 48 respectively. Alignment cavities 76, 78, 80, 82 are sized relative to alignment posts 42, 44, 46, 48 to substantially prevent lateral movement, i.e. movement within the plane defined by circuit board 26, of alignment posts 42, 44, 46, 48 within respective alignment cavities 76, 78, 80, 82. Unlike lower terminal receiving cavities 70, alignment cavities 76, 78, 80, 82 do not receive a mating terminal because alignment posts 42, 44, 46, 48 are used only for alignment purposes and are not involved with providing electrical communication.

Positive lock reinforcement members 18, 19, 20, 21 are disposed between lower housing 14 and circuit board assembly 16. Positive lock reinforcement members 18, 19, 20, 21 have features which assist in retaining mating terminals 72 with lower terminal receiving cavities 70.

Lower housing 14 may have features for receiving positive battery nut 84 and positive battery stud 86 which are each connected to bus bar 32. Positive battery nut 84 may be used for connection to a battery (not shown) of a motor vehicle while positive battery stud 86 may be used for connection to an alternator (not shown) of the motor vehicle. Positive battery nut 84 may be in electrical communication with positive battery stud 86, for example, by a portion of bus bar 32.

Upper housing 12 may be positively retained to lower housing 14 with bolt 88. The head of bolt 88 reacts against upper housing 12 while the threaded portion of bolt 88 is engaged with a mating threaded portion of lower housing 14.

In assembling electrical distribution center 10, circuit board assembly 16 is disposed within circuit board compartment 66 of upper housing 12 and retained therein by circuit board retaining clips 68. Circuit board retaining clips 68 prevent circuit board assembly 16 from coming out of circuit board compartment 66 but allow lateral movement of circuit board assembly 16 within circuit board compartment 66. Positive lock reinforcement members 18, 19, 20, 21 are assembled to lower housing 14. Next, upper housing 12/circuit board assembly 16 and lower housing 14/positive lock reinforcement members 18, 19, 20, 21 are brought together in a direction that is substantially perpendicular to the plane defined by circuit board 26. As upper housing 12/circuit board assembly 16 and lower housing 14/positive lock reinforcement members 18, 19, 20, 21 are brought closer together, alignment posts 42, 44, 46, 48 are aligned with their respectively alignment cavities 76, 78, 80, 82 by allowing circuit board assembly 16 to move laterally within circuit bard compartment. After alignment posts 42, 44, 46, 48 have been inserted part way into their respectively alignment cavities 76, 78, 80, 82; lower contact portions 38 are automatically aligned with their respective lower terminal receiving cavities 70 and lower contact portions 38 are inserted into their respective lower terminal receiving cavities 70. Finally bolt 88 may be used to apply a force perpendicular to the plane defined by circuit board 26 in order to fully seat alignment posts 42, 44, 46, 48 within their respectively alignment cavities 76, 78, 80, 82 and lower contact portions 38 within their respective lower terminal receiving cavities 70. In this way, alignment posts 42, 44, 46, 48 together with alignment cavities 76, 78, 80, 82 allow for easy alignment of lower contact portions 38 with their respective lower terminal receiving cavities 70, thereby easing assembly of electrical distribution center 10.

While this invention has been described in terms of preferred embodiments thereof, it is not intended to be so limited, but rather only to the extent set forth in the claims that follow.

We claim:

1. An electrical distribution center comprising:
   an upper housing;
   a circuit board disposed in the upper housing;
   a lower housing having a plurality of lower terminal receiving cavities and a plurality of alignment cavities;
   a plurality of terminals mounted on said circuit board, each of said plurality of terminals being in electrical communication with a respective electrically conductive member, said plurality of terminals having lower contact portions below said circuit board and disposed in said lower terminal receiving cavities, wherein each of said plurality of terminals extends from said circuit board no more than a first predetermined distance; and
   a plurality of alignment posts fixed to said circuit board and received within respective said alignment cavities, wherein each of said plurality of alignment posts extends from said circuit board at least a second predetermined distance which is greater than said first predetermined distance.

2. An electrical distribution center comprising: an upper housing; a circuit board disposed in the upper housing; a lower housing having a plurality of lower terminal receiving cavities and a plurality of alignment cavities; a plurality of terminals mounted on said circuit board, each of said plurality of terminals being in electrical communication with a respective electrically conductive member, said plurality of terminals having lower contact portions below said circuit board and disposed in said lower terminal receiving cavities, wherein each of said plurality of terminals extends from said circuit board no more than a first predetermined distance; and a plurality of alignment posts fixed to said circuit board and received within respective said alignment cavities, wherein each of said plurality of alignment posts extends from said circuit board at least a second predetermined distance which is greater than said first predetermined distance, wherein said upper housing has a plurality of upper terminal receiving cavities; wherein said circuit board is disposed below said upper terminal receiving cavities; wherein said plurality of terminals have upper contact portions above said circuit board and disposed in said upper terminal receiving cavities for engaging mating terminals plugged into said upper terminal receiving cavities, wherein each of said plurality of alignment posts are retained within said respective alignment post receiving hole with a solder connection.

3. An electrical distribution center as in claim 2 wherein each of said plurality of alignment posts include a tab that is received within a respective alignment post receiving hole in said circuit board.

4. An electrical distribution center as in claim 1 wherein each of said alignment posts are not in electrical communication with an electrically conductive member.

5. An electrical distribution center as in claim 1 wherein at least one of said alignment posts is elongated in a first direction across said circuit board.

6. An electrical distribution center as in claim 5 wherein at least one of said alignment posts is elongated in a second direction across said circuit board, wherein said second direction is substantially perpendicular to said first direction.

7. An electrical distribution center as in claim 1 wherein each of said plurality of alignment posts and said alignment cavities are sized to substantially prevent lateral movement of said plurality of alignment posts within said alignment cavities.

8. An electrical distribution center as in claim 1 wherein each of said plurality of alignment posts are located near the perimeter of said circuit board.

9. An electrical distribution center as in claim 1 wherein each of said plurality of alignment posts are substantially perpendicular to said circuit board.

10. An electrical distribution center as in claim 1 wherein each of said plurality of alignment cavities are void of electrically conductive members that could come into electrical communication with said alignment posts.

* * * * *